United States Patent [19]
Chang

[11] Patent Number: 6,072,334
[45] Date of Patent: Jun. 6, 2000

[54] SIGNAL CONVERTER WITH A DYNAMICALLY ADJUSTABLE REFERENCE VOLTAGE AND CHIPSET INCLUDING THE SAME

[75] Inventor: Nai-Shung Chang, Yung-Ho, Taiwan

[73] Assignee: VIA Technologies, Inc., Taipei Hsien, Taiwan

[21] Appl. No.: 09/206,051

[22] Filed: Dec. 4, 1998

[30] Foreign Application Priority Data

Jul. 16, 1998 [TW] Taiwan .................................. 87111576

[51] Int. Cl.[7] .............................................. H03K 19/0175
[52] U.S. Cl. ................................ 326/82; 326/63; 326/80; 326/86
[58] Field of Search .................................. 326/80, 81, 82, 326/63, 68, 86, 90

[56] References Cited

U.S. PATENT DOCUMENTS

| | | | |
|---|---|---|---|
| 4,931,672 | 6/1990 | Khan | 326/90 |
| 5,534,801 | 7/1996 | Wu et al. | 327/72 |
| 5,877,633 | 7/1996 | Ng et al. | 326/80 |

*Primary Examiner*—Jon Santamauro
*Assistant Examiner*—Don Phu Le
*Attorney, Agent, or Firm*—Jiawei Huang; J.C. Patents

[57] ABSTRACT

A signal converter with a dynamically adjustable reference voltage according to the invention, which can receive different qualities of signals. The signal converter includes an input circuit and a reference voltage generator. The input circuit converts a first digital signal, such as a GTL+ signal, into a second digital signal, such as a TTL or CMOS signal, based on an adjustable reference voltage generated by the reference voltage generator. When a control circuit needs to receive the first digital signal from outside via the input circuit, the control circuit can adjust the reference voltage by controlling the reference voltage generator so as to receive the first digital signal with a different quality.

31 Claims, 3 Drawing Sheets

SIGNAL CONVERTER WITH A DYNAMICALLY ADJUSTABLE REFERENCE VOLTAGE AND CHIPSET INCLUDING THE SAME

CROSS-REFERENCE TO RELATED APPLICATION

This application claims the priority benefit of Taiwan application serial no. 87111576, filed Jul. 16, 1998, the full disclosure of which is incorporated herein by reference.

BACKGROUND OF THE INVENTION

1. Field of the Invention

The invention relates to a signal converter, and in particular to a signal converter with a dynamically adjustable reference voltage which can receive different qualities of digital signals.

2. Description of the Related Art

In a typical digital circuit, two digital signals with 0 V and 5 V generally represent two different logic levels. Devices used in digital circuits include TTL and CMOS devices. Digital circuits including TTL devices have faster switch speeds, but consume more DC power. In contrast, digital circuits including CMOS devices consume less DC power, but have a slower switch speed and higher noise. Furthermore, when the operating frequency of digital circuits increases to several tens of NHz, devices improperly arranged or separated from each other in the digital circuits can cause Electro Magnetic Interference (EMI).

Recently, another electronic signal specification, called a Gunning Transceiver Logical (GTL+) specification, has been introduced. The magnitude of the GTL+ signal is in the range of 0–1.5 V. Moreover, one terminal of a signal transmission line is electrically connected to a power source with 1.5 v via a terminator with a resistance of 56Ω which prevents signal reflections and is used for impedance matching on a printed circuit board (PCB). Since the range of the magnitude of the GTL+ signal is only 1.5 V, circuits adopting the GTL+ signal specification have the advantages of low power consumption and high speed, and resolve the EMI problem.

Generally, in a computer system with an operating frequency of several hundred of MHz, a central processing unit (CPU) uses a GTL+ bus to communicate with other devices. Referring to FIG. 1, a GTL+ bus 130 is used to communicate between two devices 110 and 120. In FIG. 1, the devices 110 and 120 can be a chipset and a CPU on a printed circuit board, respectively. The CPU 120 communicates with the chipset 110 via the GTL+ bus 130, thereby allowing the chipset 110 to control other devices (not shown) on a printed circuit board.

As shown in FIG. 1, the devices 110 and 120 are electrically connected to each other by the GTL+ bus 130, which serves as a transmission line. The device 110 includes an input buffer 114 and an output buffer 112. The input buffer 114 is used to convert a first digital signal, such as a GTL+ signal, received from the GTL+ bus 130 into a second digital signal, such as a TTL signal which meets the signal specification for the device 110. The output buffer 112 is used to convert a second digital signal, such as a TTL signal, from the device 110 into a first digital signal, such as a GTL+ signal, which is further transmitted to the device 120 via the GTL+ bus 130. Similarly, the device 120 also includes an input buffer 124 and an output buffer 122 which are used for signal conversion between a first digital signal, such as a GTL+ signal and a second digital signal, such as a GTL+ signal, which meet the signal specification of the device 120.

As shown in FIG. 1, the devices 110 and 120 are electrically connected to either end of the transmission line 130, respectively, wherein both ends are electrically connected to a power source Vtt via two terminators Rt1 and Rt2, respectively. The terminators Rt1 and Rt2 not only improve signal qualities, but also can pull the potentials of signals due to an open drain connection adopted for the output buffers. However, the status of the impedance matching affects the signal quality on the transmission line. In particular, when transmission speed is increased, ring back occurs on the GTL+ signal. Referring to FIG. 2, wave forms for the GTL+ bus are shown, wherein a wave form (A) is an ideal wave form while a wave form (B) is a distorted wave form caused by a ring back P. When the terminators do not match the impedance of input/output circuits well, the ring back P becomes stronger.

A prior input buffer converts a GTL+ signal into another logic signal, based on a fixed reference voltage. When the potential of the GTL+ signal is higher than the reference voltage, the output logic signal is set at a logic level "1". Inversely, when the potential of the GTL+ signal is lower than the reference voltage, the output logic signal is set at a logic level "0". In general, the Vtt is set at 1.5 V while the reference voltage is set at 1.0 V±200 mV. When the ring back incurred is strong enough to surpass a predetermined reference voltage, an error conversion is encountered.

Furthermore, since the GTL+ bus 130 connected to the chipset 110 includes a great number of transmission lines, terminators are built in the chipset 110 to reduce the complexity of the external circuit designs. Therefore, the terminators not only affect the qualities of signals, but also can increase power consumption. Taking a CPU, such as the PENTIUM II produced by INTEL, as an example, if each terminator used has a resistance of 56Ω, the number of transmission lines are as many as 100, and Vtt is set at 1.5 V. Additional power consumption is estimated at 47.8 mW. That is, the higher the number of the transmission lines is, the higher the additional power consumption will be. In addition, the higher power consumption directly creates heat on the CPU, resulting in a temperature increase on the CPU. On the other hand, if other control chipsets related to the CPU adopt the same terminators as the CPU, each of them consumes about the same amount of power. As a result, heat caused by the terminators can affect the stability of the CPU and chipsets. Originally, the power consumption of the CPU and chipsets is greatly increased in line with the increase of the CPU operating frequency. If the additional power consumption caused by the terminators is further taken into account, it is necessary to use larger fins for heat dissipation for the CPU and chipsets. Moreover, the heat dissipation needs to be taken into consideration when manufacturing chips. For example, a multiple-layer chip substrate with layers increased from 2 to 4 is manufactured to provide better heat dissipation. However, it increases the manufacturing cost.

To prevent creating the additional heat caused by the terminators, the resistance of the terminators can be increased. However, the ring back of the GTL+ signal becomes stronger if the resistance of terminators on both ends of a transmission line cannot be maintained at the same value. In practice, it is difficult to maintain the resistance of the terminators on both ends of the transmission line at the same value, because the CPU and chipsets are generally produced by different manufacturers. Therefore, it is necessary to adopt another method to resolve the ring back problem. For example, a fixed reference voltage for detecting an input GTL+ signal adopted by an input buffer according to the prior art can be replaced with an adjustable reference voltage, thereby resolving the ring back problem.

In short, the input buffer adopting a fixed reference voltage for converting an input GTL+ signal has the following disadvantages.

(1) When the resistance of the terminators is lower and the number of the transmission lines is higher, much more power is consumed, resulting in creation of a great amount of heat. As a result, a better head dissipation needs to be taken into account when manufacturing chips. This causes higher manufacturing cost.

(2) The temperatures of the chips are increased following the great amount of heat created, leading to a poor stability.

SUMMARY OF THE INVENTION

An object of the invention is to provide a signal converter with a dynamically adjustable reference voltage which can tolerate an overly strong ring back and reduce addition power consumption and heat created by high-resistance terminators.

To attain the object mentioned above, a signal converter according to the invention, with a dynamically adjustable reference voltage and electrically connected between a control circuit and a bus, comprises an input circuit and a reference voltage generator.

The input circuit has an input end coupled to the bus and an output end coupled to the control circuit. It is configured to convert a first digital signal coming from the bus into a second digital signal comprising a first logic level and a second logic level, and then output the second signal to the control circuit, based on an adjustable reference voltage. The second digital signal is set at the first logic level when the potential of the first digital signal is higher than the adjustable reference voltage. Inversely, the second digital signal is set at the second logic level when the potential of the first digital signal is lower than the adjustable reference voltage.

The reference voltage generator is controlled by the control circuit and outputs an adjustable reference voltage comprising a first potential and a second potential for the use of the input circuit. The adjustable reference voltage is changed into the first potential by controlling the reference voltage generator when the control circuit sends out the second digital signal toward the bus. In contrast, the adjustable reference voltage is changed into the second potential by controlling the reference voltage generator when the bus sends out the first digital signal toward the control circuit.

Furthermore, the signal converter further comprises an output circuit having an output circuit having an input end coupled to the control circuit and an output end coupled to the bus for converting the second digital signal into the first digital signal, based on the adjustable reference voltage.

According to the invention, the bus is a GTL+ bus. The second potential (such as 1.2 V) is higher than the first potential (such as 1.0 V).

BRIEF DESCRIPTION OF THE DRAWINGS

The present invention will be more fully understood from the detailed description given hereinbelow and the accompanying drawings which are given by way of illustration only, and thus do not limit the present invention, and wherein.

DETAILED DESCRIPTION OF THE INVENTION

Figure 1:
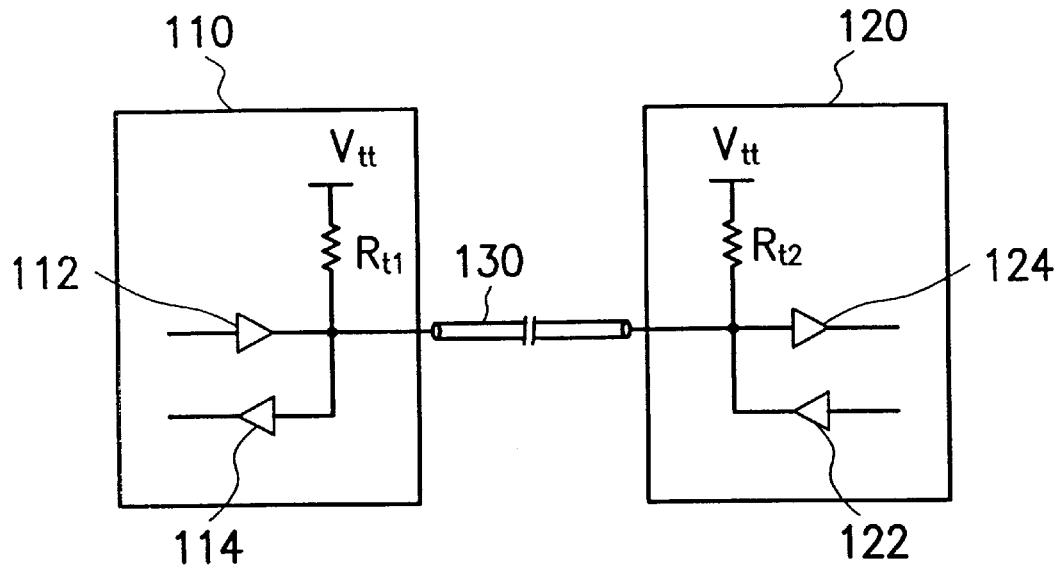
FIG. 1 is a schematic view showing two devices electrically connected to each other via a GTL+ bus.
Figure 2:
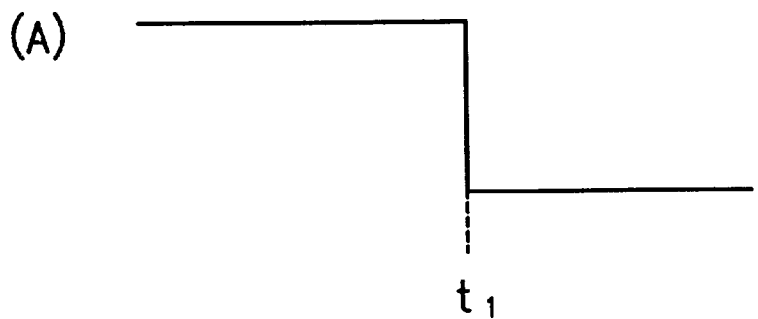
FIG. 2 is a schematic view showing waveforms for the GTL+ bus.
Figure 2:
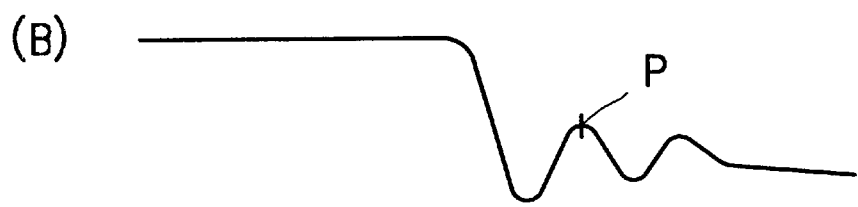
Figure 3:
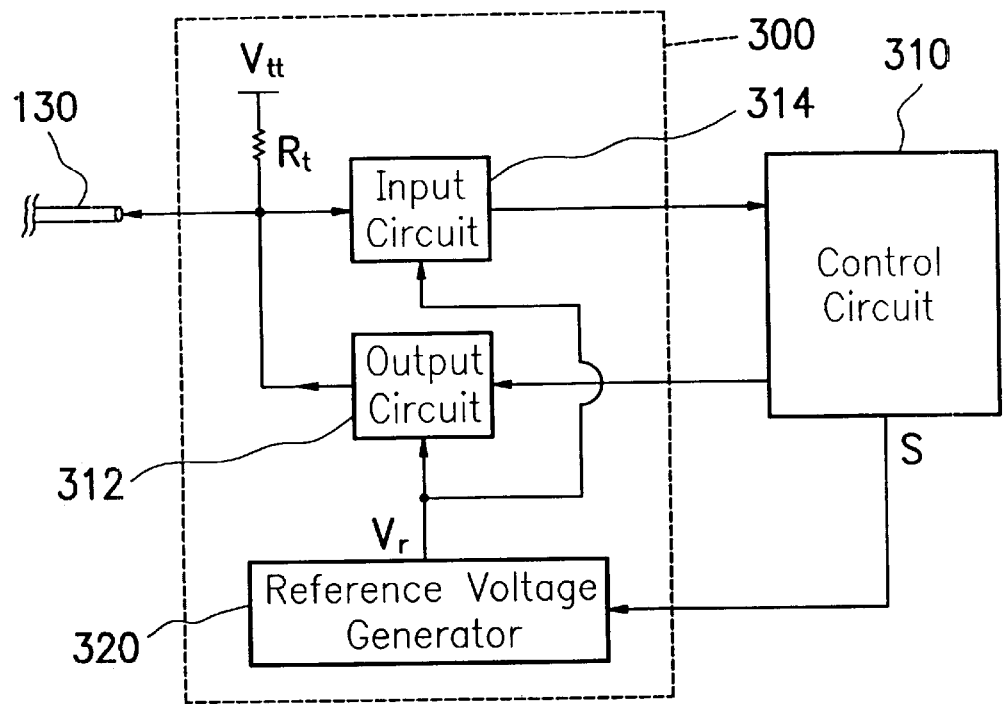
FIG. 3 is a circuit block diagram showing a signal converter with a dynamically adjustable reference voltage according to the invention.

Referring to FIG. 3, a signal converter with a dynamically adjustable reference voltage according to a preferred embodiment of the invention is shown. In FIG. 3, a signal converter 300 is electrically connected between a control circuit 310 and a bus 130, such as a GTL+ bus, for signal conversion.

As shown in FIG. 3, the signal converter 300 includes an input circuit 314, an output circuit 312 and a reference voltage generator 320. The input circuit 314 and the output circuit 312 are electrically connected between the control circuit 310 and the bus 130 for signal conversion. Furthermore, one end of the bus 130 is electrically connected to a power source Vtt via a terminator Rt. The reference voltage generator 320 produces a reference voltage Vr to the input circuit 314 and the output circuit 312.

The input circuit 314 converts a first digital signal, such as a GTL+ signal, coming from the bus 130 into a second digital signal, such as a TTL signal or a CMOS signal, acceptable to the control circuit 310. During the signal conversion, if the potential of the first digital signal is higher than a reference voltage Vr with a first adjustable potential output from the reference voltage generator 320, the second digital signal is set at a logic level "1". Inversely, if the potential of the first digital signal is lower than the first adjustable potential Vr, the second digital signal is set at a logic level "0." Moreover, when the control circuit 310 needs to receive the first digital signal coming from the bus 130 via the input circuit 314, the first potential Vr can be adjusted according to the quality of the first digital signal. Therefore, tolerance of the ring back created on the first digital signal can be greatly broadened.

Furthermore, the first potential Vr is adjusted by the control signal S output from the control circuit 310. In general, the first potential Vr supplied to the input circuit 314 is determined according to a real circuit design. For example, if the Vtt is 1.5 V, the first potential Vr is set at 1.0 V. In the case of only increasing the resistance of the terminator Rt to cause a more serious ring back, the first potential Vr can be adjusted to increase up to a potential of 1.2 V or higher, thereby tolerating stronger ring back.

On the other hand, when the control circuit 310 needs to transmit a second digital signal, such as a TTL or CMOS signal, to the bus 130 via the output circuit 312, the control circuit 310 makes the reference voltage generator 320 output a reference voltage Vr with a second potential, such as 1 V, to the output circuit 312 by the control signal S for signal conversion. After the control circuit 310 completely transmits the second digital signal, the control circuit 310 makes the reference voltage generator 320 output a reference voltage Vr with a first adjustable potential, such as 1.2 V, by the control signal S to the input circuit 314 so as to receive a first digital signal, such as a GTL+ signal, coming from the bus 130.

As can be seen from the above, the first potential Vr can be adjusted (or increased) to tolerate the stronger ring back caused by a poor impedance matching on the terminator Rt.

Similarly, after the bus 130 has completely transmitted the first digital signal to the control circuit 310, the control circuit 310 makes the reference voltage generator 320 output a reference voltage Vr with a second potential to the output circuit 312 if the control circuit 310 needs to transmit a digital signal, such as TTL or CMOS signal, toward the bus 130 again.

Figure 4:
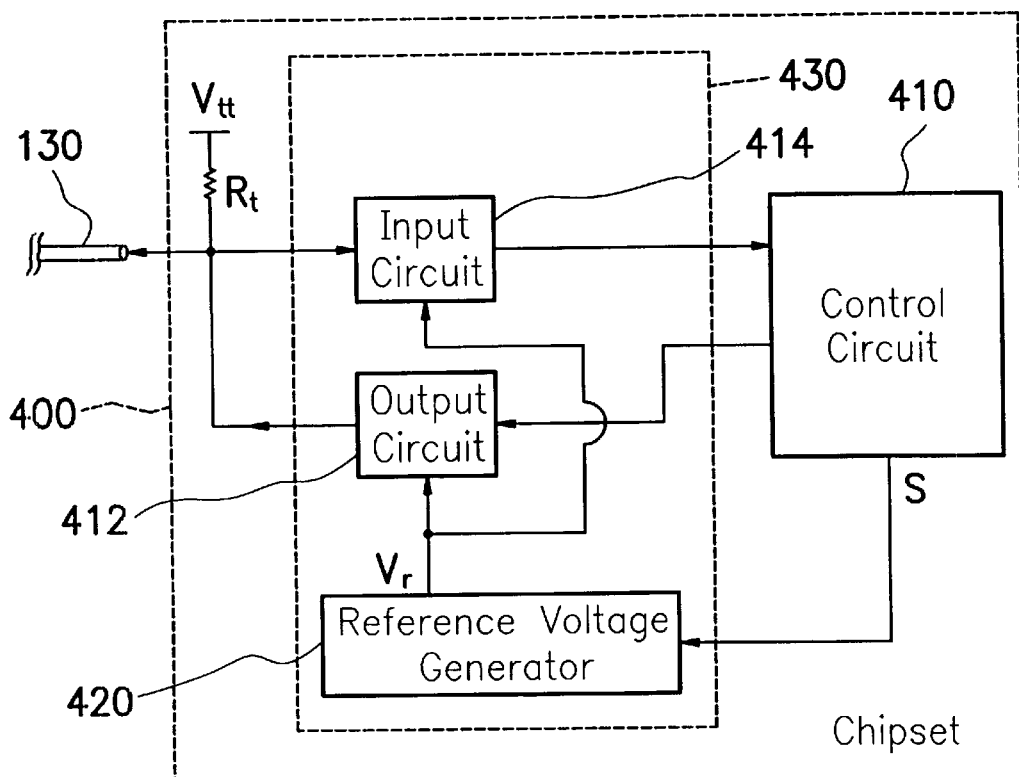
FIG. 4 is a circuit block diagram showing a chipset including a signal converter with a dynamically adjustable reference voltage according to the invention.

The signal converter with a dynamically adjustable reference voltage according to the invention is suitable for a chipset on a printed circuit board so as to cooperate with a CPU adopting a GTL+ signal specification. Referring to FIG. 4, a chipset including a signal converter according to the invention is shown. A chipset 400 includes a control circuit 410, an input circuit 414, an output circuit 412 and a reference voltage generator 420. The control circuit 410 controls the operation of the entire chipset 400 and the reference voltage generator 420 to create an adjustable reference voltage Vr. The control circuit 410 and external circuits (not shown) connected to the GTL+ bus 130 communicate with each other via the input circuit 414 and the output circuit 412. The input circuit 414, output circuit 412 and reference voltage generator 420 constitute a signal converter 430 with the same operation stated above.

Figure 5:
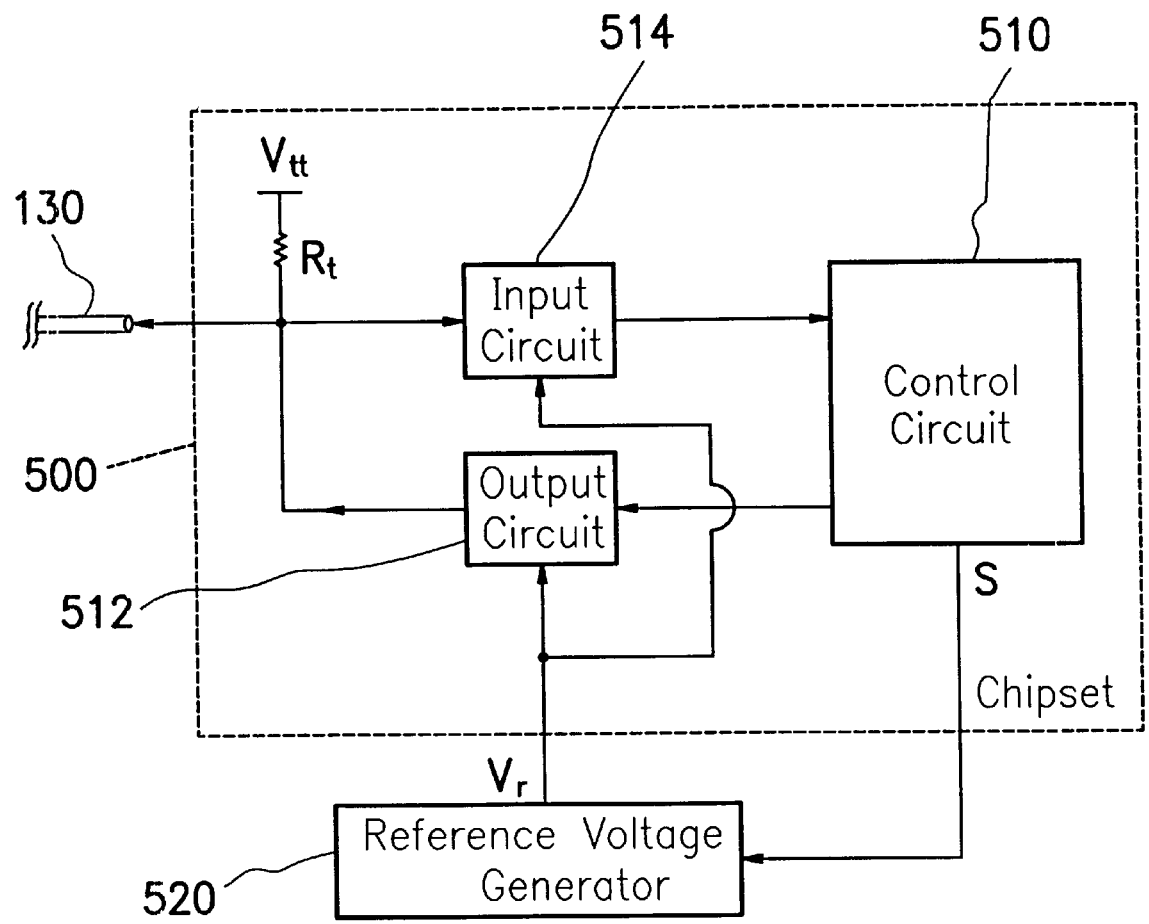
FIG. 5 is a circuit block diagram showing a chipset including a signal converter with a reference voltage supplied from outside according to the invention.

As described above, a signal converter according to the invention can be integrated into a chipset on a printed circuit board so as to cooperate with a CPU adopting a GTL+ signal specification. Moreover, a reference voltage can be supplied from outside to be used by the signal converter included inside a chipset. Referring to FIG. 5, a chipset including a signal converter with an external reference voltage generator is shown. In FIG. 5, a chipset 500 includes a control circuit 510, an input circuit 514 and an output circuit 512. An adjustable reference voltage Vr for use of the input circuit 514 and the output circuit 512 during signal conversions is provided from an external reference voltage generator 520. The control circuit 510 controls the operation of the entire chipset 500 and the external reference voltage generator 520 to generate the adjustable reference voltage Vr. Furthermore, the control circuit 510 and circuits (not shown) outside the chipset 500 communicate with each other via the input circuit 514 and the input circuit 512. The operation of the chipset 500 is similar to that described above.

In a signal converter according to the invention, when a first digital signal, such as an external GTL+ signal, transmitted thereto has a more serious ring back problem, it can be resolved by adjusting (increasing) a reference voltage Vr, thereby avoiding abnormal operations caused by a poor impedance matching on a terminator. When sending out a second digital signal, such as a TTL or CMOS signal, therefrom, the reference voltage Vr is changed into a second potential for use of the output circuit.

Compared to a signal converter with a fixed reference voltage of the prior art, a single converter with a dynamically adjustable reference voltage according to the invention has the following advantages. Even though a corresponding terminator causing a more serious ring back is unable to be further changed into a consistent resistance, the reference voltage can be dynamically adjusted to resolve the ring back problem when receiving the GTL+ digital signal. Therefore, a higher-resistance terminator can be used to reduce additional power loss and heat created. This results in lower cost and makes consideration of the heat dissipation problem unnecessary when manufacturing. In addition, the system becomes more stable because less heat is created.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangement.

What is claimed is:

1. A signal converter with a dynamically adjustable reference voltage, electrically connected between a control circuit and a bus, the signal converter comprising:

an input circuit having an input end coupled to the bus and an output end coupled to the control circuit for converting a first digital signal coming from the bus into a second digital signal, comprising a first logic level and a second logic level, acceptable to the control circuit, based on the adjustable reference voltage, wherein the second digital signal is set at the first logic level when the potential of the first digital signal is higher than the adjustable reference voltage, and the second digital signal is set at the second logic level when the first digital signal is lower than the adjustable reference voltage; and a reference voltage generator controlled by the control circuit to output the adjustable reference voltage comprising a first potential and a second potential for the use of the input circuit, wherein the adjustable reference voltage is changed into the first potential by controlling the reference voltage generator when the control circuit sends out the second digital signal toward the bus, and the adjustable reference voltage is changed into the second potential by controlling the reference voltage generator when the bus sends out the first digital signal toward the control circuit.

2. The signal converter as recited in claim 1, further comprising an output circuit having an input end coupled to the control circuit and an output end coupled to the bus for converting the second digital signal into the first digital signal, based on the adjustable reference voltage.

3. The signal converter as recited in claim 1, wherein the bus is a GTL+ bus.

4. The signal converter as recited in claim 3, wherein the first digital signal is a GTL+ signal.

5. The signal converter as recited in claim 4, wherein the second digital signal is a TTL or CMOS signal.

6. The signal converter as recited in claim 1, wherein the second potential is higher than the first potential.

7. The signal converter as recited in claim 6, wherein the first potential is 1.0 V.

8. The signal converter as recited in claim 7, wherein the second potential is 1.2 V.

9. A signal converter with a dynamically adjustable reference voltage, electrically connected between a control circuit and a bus, the signal converter comprising:

an input circuit having an input end coupled to the bus and an output end coupled to the control circuit for converting a first digital signal coming from the bus into a second digital signal acceptable to the control circuit, based on the adjustable reference voltage;

an output circuit having an input end coupled to the control circuit and an output end coupled to the bus for converting the second digital signal from the control circuit into the first digital signal to the bus;

a reference voltage generator controlled by the control circuit to output the adjustable reference voltage comprising a first potential and a second potential for the use of the input circuit and the output circuit, wherein the adjustable reference voltage is changed into the first potential by controlling the reference voltage generator when the control circuit sends out the second digital signal toward the bus, and the adjustable reference voltage is changed into the second potential by controlling the reference voltage generator when the bus sends out the first digital signal toward the control circuit.

10. The signal converter as recited in claim 9, wherein the bus is an GTL+ bus.

11. The signal converter as recited in claim 10, wherein the first digital signal is a GTL+ signal.

12. The signal converter as recited in claim 11, wherein the second digital signal is a TTL or CMOS signal.

13. The signal converter as recited in claim 9, wherein the second potential is higher than the first potential.

14. The signal converter as recited in claim 13, wherein the first potential is 1.0 V.

15. The signal converter as recited in claim 14, wherein the second potential is 1.2 V.

16. A chipset including a signal converter with a dynamically adjustable reference voltage, which is coupled to a bus, the chipset comprising:
   a control circuit for controlling the operation of the chipset;
   an input circuit having an input end coupled to the bus and an output end coupled to the control circuit for converting a first digital signal coming from the bus into a second digital signal acceptable to the control circuit, based on the adjustable reference voltage; and
   a reference voltage generator controlled by the control circuit to output the adjustable reference voltage comprising a first potential and a second potential for the use of the input circuit, wherein the adjustable reference voltage is changed into the first potential by controlling the reference voltage generator, and the adjustable reference voltage is changed into the second potential by controlling the reference voltage generator when the bus sends out the first digital signal toward the control circuit.

17. The chipset as recited in claim 16, further comprising an output circuit having an input end coupled to the control circuit and an output end coupled to the bus for converting the second digital signal into the first digital signal, based on the adjustable reference voltage.

18. The chipset as recited in claim 16, wherein the bus is a GTL+ bus.

19. The chipset as recited in claim 18, wherein the first digital signal is a GTL+ signal.

20. The chipset as recited in claim 19, wherein the second digital signal is a TTL or CMOS signal.

21. The chipset as recited in claim 16, wherein the second potential is higher than the first potential.

22. The chipset as recited in claim 21, wherein the first potential is 1.0 V.

23. The chipset as recited in claim 22, wherein the second potential is 1.2 V.

24. A chipset including a signal converter with a dynamically adjustable reference voltage, which is coupled to a bus and a reference voltage generator, wherein the reference voltage generator is controlled to generate the adjustable reference voltage comprising a first potential and a second potential by the chipset, the chipset comprising:
   a control circuit for controlling the operation of the chipset and the reference voltage generator; and
   an input circuit having an input end coupled to the bus and an output end coupled to the control circuit for converting a first digital signal coming from the bus into a second digital signal acceptable to the control circuit, based on the adjustable reference voltage, wherein the adjustable reference voltage is changed into the first potential by controlling the reference voltage generator when the control circuit sends out the second digital signal toward the bus, and the adjustable reference voltage is changed into the second potential by controlling the reference voltage generator when the bus sends out the first digital signal toward the control circuit.

25. The chipset as recited in claim 24, further comprising an output circuit having an input end coupled to the control circuit and an output end coupled to the bus for converting the second digital signal into the first digital signal, based on the adjustable reference voltage.

26. The chipset as recited in claim 24, wherein the bus is a GTL+ bus.

27. The chipset as recited in claim 26, wherein the first digital signal is a GTL+ signal.

28. The chipset as recited in claim 27, wherein the second digital signal is a TTL or CMOS signal.

29. The chipset as recited in claim 24, wherein the second potential is higher than the first potential.

30. The chipset as recited in claim 29, wherein the first potential is 1.0 V.

31. The chipset as recited in claim 30, wherein the second potential is 1.2 V.

* * * * *